(12) United States Patent
Pope

(10) Patent No.: US 11,811,401 B2
(45) Date of Patent: Nov. 7, 2023

(54) DUAL-MODE OPERATION OF APPLICATION SPECIFIC INTEGRATED CIRCUITS

(71) Applicant: Google LLC, Mountain View, CA (US)

(72) Inventor: Reiner Pope, Mountain View, CA (US)

(73) Assignee: Google LLC, Mountain View, CA (US)

( * ) Notice: Subject to any disclaimer, the term of this patent is extended or adjusted under 35 U.S.C. 154(b) by 79 days.

(21) Appl. No.: 17/634,744

(22) PCT Filed: Aug. 14, 2020

(86) PCT No.: PCT/US2020/046287
§ 371 (c)(1),
(2) Date: Feb. 11, 2022

(87) PCT Pub. No.: WO2021/030653
PCT Pub. Date: Feb. 18, 2021

(65) Prior Publication Data
US 2022/0286135 A1  Sep. 8, 2022

Related U.S. Application Data

(60) Provisional application No. 62/886,481, filed on Aug. 14, 2019.

(51) Int. Cl.
*H03K 19/17736* (2020.01)
*G06N 3/063* (2023.01)
*H03K 19/17748* (2020.01)

(52) U.S. Cl.
CPC ......... *H03K 19/1774* (2013.01); *G06N 3/063* (2013.01); *H03K 19/17748* (2013.01)

(58) Field of Classification Search
None
See application file for complete search history.

(56) References Cited

U.S. PATENT DOCUMENTS 7,840,914 B1  11/2010 Agarwal et al.
8,990,651 B2  3/2015 Miller et al.
(Continued)

FOREIGN PATENT DOCUMENTS

CN  101566972  10/2009
CN  104603795  5/2015
(Continued)

OTHER PUBLICATIONS

International Preliminary Report on Patentability in International Appln. No. PCT/US20/46287, dated Feb. 8, 2022, 10 pages.
(Continued)

*Primary Examiner* — Jany Richardson
(74) *Attorney, Agent, or Firm* — Fish & Richardson P.C.

(57) ABSTRACT

A method for operating an integrated circuit chip including multiple tiles (202a-202d) includes determining a configuration for the tiles for execution of a computation. When the configuration for the tiles satisfies a first criterion, the integrated circuit is operated in a first mode, including concurrently receiving respective input data (208a, 208b) at each of the tiles (202a-202d). When the configuration for the tiles satisfies a second criterion, the integrated circuit is operated in a second mode, including: at a first time, concurrently receiving respective first input data (208a, 208b) at each tile (202a, 202b) of a first group of tiles; at the first time, storing respective second input data (208a, 208b) in each of multiple delay registers (212a, 212b), each delay register corresponding to a tile (202c, 202d) of a second group of tiles; at a second time, releasing the second input data from the delay registers (212a, 212b) and receiving the released respective second input data at each tile (202c, 202d) of the second group of tiles.

20 Claims, 5 Drawing Sheets

(56) References Cited

U.S. PATENT DOCUMENTS

| | | | |
|---|---|---|---|
| 9,529,947 B1 * | 12/2016 | Chiu | G06F 30/398 |
| 9,660,650 B1 | 5/2017 | Manohararajah et al. | |
| 10,169,518 B1 | 1/2019 | Iyer | |
| 11,675,588 B2 * | 6/2023 | Vanesko | G06F 9/3005 |
| | | | 365/189.011 |
| 2008/0034235 A1 | 2/2008 | Houshaku | |
| 2008/0061834 A1 | 3/2008 | Tetsukawa et al. | |
| 2016/0357899 A1 | 12/2016 | Gamsa et al. | |

FOREIGN PATENT DOCUMENTS

| | | |
|---|---|---|
| CN | 106250577 | 12/2016 |
| JP | 2006-163815 | 6/2006 |
| JP | 2007-293556 | 11/2007 |
| JP | 2012-194774 | 10/2012 |
| JP | 2019-109892 | 7/2019 |

OTHER PUBLICATIONS

International Search Report and Written Opinion in International Appln. No. PCT/US20/46287, dated Dec. 1, 2020, 13 pages.
Office Action in Taiwan Appln. No. 109127786, dated Apr. 14, 2021, 9 pages (with English translation).
Office Action in Chinese Appln. No. 202080057338.4, dated Sep. 9, 2022, 14 pages (with English translation).
Notice of Allowance in Chinese Appln. No. 202080057338.4, dated Mar. 8, 2023, 5 pages (with English translation).
Office Action in Japanese Appln. No. 2022-508894, dated Apr. 10, 2023, 20 pages (with English translation).

* cited by examiner

DUAL-MODE OPERATION OF APPLICATION SPECIFIC INTEGRATED CIRCUITS

CROSS-REFERENCE TO RELATED APPLICATIONS

This application is a National Stage Application under 35 U.S.C. § 371 and claims the benefit of International Application No. PCT/US2020/046287 filed Aug. 14, 2020, which claims priority to U.S. Patent Application Ser. No. 62/886,481, filed on Aug. 14, 2019, the entire contents of which are hereby incorporated by reference.

BACKGROUND

Neural networks are machine learning models that employ one or more layers of models to generate an output, e.g., a classification, for a received input. Some neural networks include one or more hidden layers in addition to an output layer. The output of each hidden layer is used as input to the next layer in the network, i.e., the next hidden layer or the output layer of the network. Each layer of the network generates an output from a received input in accordance with current values of a respective set of parameters.

Some neural networks include one or more convolutional neural network layers. Each convolutional neural network layer has an associated set of kernels. Kernels can be represented as a matrix structure of weight inputs. Each convolutional layer can also process a set of activation inputs. The set of activation inputs can also be represented as a matrix structure.

Some existing systems perform computations for a given convolutional layer in software. For example, the software can apply each kernel for the layer to the set of activation inputs. That is, for each kernel, the software can overlay the kernel, which can be represented multi-dimensionally, over a first portion of activation inputs, which can be represented multi-dimensionally. The software can then compute a dot product from the overlapped elements. The dot product can correspond to a single activation input, e.g., an activation input element that has an upper-left position in the overlapped multi-dimensional space. For example, using a sliding window, the software then can shift the kernel to overlay a second portion of activation inputs and calculate another dot product corresponding to another activation input. The software can repeatedly perform this process until each activation input has a corresponding dot product. In some implementations, the dot products are input to an activation function, which generates activation values. The activation values can be combined, e.g., pooled, before being sent to a subsequent layer of the neural network.

SUMMARY

We describe here integrated circuits, such as application specific integrated circuits (ASICs) that can be operated in one of two modes based on the configuration of the integrated circuit for execution a given computation. The integrated circuit includes an array of tiles. In one mode, every tile that is involved in a given computation receives input data for processing at the same time, e.g., the same clock cycle, as each other tile. In another mode, a delay is intentionally introduced into the operation of a subset of the tiles, such that the timing of the data processing is staggered among the subsets of tiles. Operation of the integrated circuit in the second can, for instance, make the integrated circuit robust against attacks by enabling the power consumption and rate of current change of the integrated circuit to remain within design constraints of the integrated circuit.

In an aspect, a method for operating an integrated circuit chip including multiple tiles includes determining a configuration for the tiles of the integrated circuit for execution of a computation. The method includes, when the configuration for the tiles satisfies a first criterion, operating the integrated circuit in a first mode, including concurrently receiving respective input data for the computation at each of the tiles of the integrated circuit. The method includes, when the configuration for the tiles satisfies a second criterion, operating the integrated circuit in a second mode, including: at a first time, concurrently receiving respective first input data for the computation at each tile of a first group of tiles of the integrated circuit; at the first time, storing respective second input data for the computation in each of multiple delay registers, each delay register corresponding to a tile of a second group of tiles of the integrated circuit; at a second time, releasing the second input data from the delay registers and receiving the released respective second input data at each tile of the second group of tiles.

Embodiments can include one or any combination of two or more of the following features.

Determining a configuration for the tiles for execution of the computation includes determining one or more of a number and a percentage of tiles operable for executing the computation. The first criterion includes the number or percentage of tiles operable for executing the computation being less than a threshold number or percentage, and the second criterion includes the number or percentage of tiles operable for executing the computation being greater than a threshold number or percentage.

Determining a configuration for the tiles for execution of the computation includes determining a number of columns of tiles operable for executing the computation. The first criterion includes the number or percentage of columns of tiles operable for executing the computation being less than a threshold number or percentage, and the second criterion includes the number or percentage of columns of tiles operable for executing the computation being greater than a threshold number or percentage.

The method includes determining whether the configuration for the tiles satisfies the first criterion or the second criterion.

Operating the integrated circuit in a second mode includes operating a multiplexer to enable the delay registers. Operating the integrated circuit in a first mode includes operating the multiplexer to disable the delay registers.

The first time is a first clock cycle and the second time is the next clock cycle.

Concurrently receiving respective input data in the first mode includes receiving a vector of input data at each tile.

Operating the integrated circuit in a first mode includes operating each of the tiles of the integrated circuit to process the respective input data.

Operating the integrated circuit in a second mode includes: operating each of the tiles of the first group to process the respective first input data; and operating each of the tiles of the second group to process the respective second input data released from the delay register.

The method includes receiving an indication of the first criterion and the second criterion from a compiler.

In an aspect, an integrated circuit includes multiple delay registers each connected to a corresponding first bus line; multiple tiles, each tile of a first group of the tiles connected to a corresponding second bus line, and each tile of a second group of the tiles connected to a corresponding one of the first bus lines; and a controller configured to determine a configuration of the first and second groups of tiles for execution of a computation. When the configuration for the tiles satisfies a first criterion, the controller is configured to control the integrated circuit to operate in a first mode in which respective input data for the computation is concurrently received at each of the multiple tiles via the first and second bus lines. When the configuration for the tiles satisfies a second criterion, the controller is configured to control the integrated circuit to operate in a second mode, in which at a first time, respective first input data for the computation is concurrently received at each tile of the first group of tiles; at the first time, second input data for the computation is stored in each of the delay registers; and at a second time, the second input data is released from the delay registers and the respective second input data is received at each tile of the second group of tiles.

Embodiments can include one or any combination of two or more of the following features.

The integrated circuit includes a multiplexer connected to each second bus line.

The tiles are arranged in a two-dimensional array.

The integrated circuit includes an application-specific integrated circuit (ASIC).

Each tile includes: multiple computational cells; a memory coupled to the computational cells; and controllable bus lines configured to convey data to or from the tile.

At least one of the tiles is configured to act as the controller.

The integrated circuit includes a communication interface.

The operation of an integrated circuit, such as an application-specific integrated circuit (ASIC) in either a first, concurrent mode or a second, interleaved mode can have one or more of the following advantages. The integrated circuit can be operated in a way that is robust against attacks, and can also be operated in an efficient manner for rapid processing in appropriate situations. The selection of the mode of operation is automated and can be made dynamically, e.g., to select a mode on a per-calculation basis.

The details of one or more embodiments of the invention are set forth in the accompanying drawings and the description below. Other features and advantages will be apparent from the description, the drawings, and the claims.

DETAILED DESCRIPTION

We describe here integrated circuits, such as application specific integrated circuits (ASICs) that can be operated in one of two modes based on the configuration of the integrated circuit for execution a given computation. The integrated circuit includes an array of tiles. In one mode, every tile that is involved in a given computation receives input data for processing at the same time, e.g., the same clock cycle, as each other tile. In another mode, a delay is intentionally introduced into the operation of a subset of the tiles, such that the timing of the data processing is staggered among the subsets of tiles. Operation of the integrated circuit in the second can, for instance, make the integrated circuit robust against attacks by enabling the power consumption and rate of current change of the integrated circuit to remain within design constraints of the integrated circuit.

Figure 1:
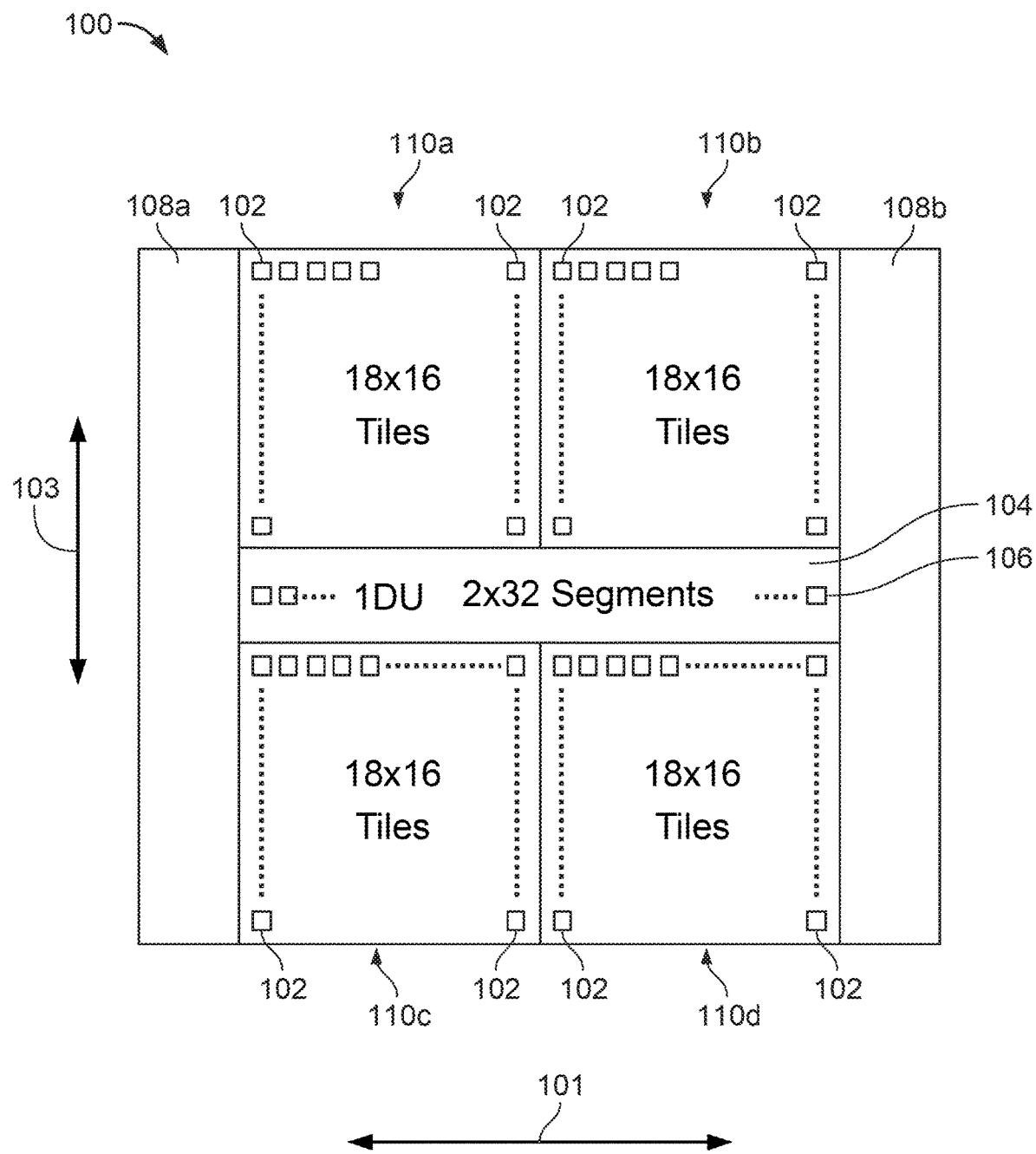
FIG. 1 is a schematic that illustrates an example of special purpose logic circuitry.

FIG. 1 is a schematic that illustrates an example of special purpose logic circuitry, in particular, an ASIC 100. The ASIC 100 includes multiple tiles 102, in which one or more of the tiles 102 includes special purpose circuitry configured to perform operations, such as e.g., multiplication and addition operations, based on input data. In particular, each tile 102 can include a computational array of cells, in which each cell is configured to perform mathematical operations. In some implementations, the tiles 102 are arranged in a grid pattern, with tiles 102 arranged along a first dimension 101 (e.g., rows) and along a second dimension 103 (e.g., columns). For instance, in the example shown in FIG. 1, the tiles 102 are divided into four different sections (110a, 110b, 110c, 110d), each section containing 288 tiles arranged in a grid of 18 tiles down by 16 tiles across. In some implementations, the ASIC 100 shown in FIG. 1 may be understood as including a single systolic array of cells subdivided/arranged into separate tiles, in which each tile includes a subset/sub-array of cells, local memory and bus lines. Outputs from the tiles 102 are provided to a vector processing unit 104 that computes vector computation output values based on the outputs from the tiles 102. The vector processing unit 104, and the operation of the ASIC 100, is discussed further below.

The ASIC 100 also includes a vector processing unit 104. The vector processing unit 104 includes circuitry configured to receive outputs from the tiles 102 and compute vector computation output values based on the outputs received from the tiles 102. For example, in some implementations, the vector processing unit 104 includes circuitry (e.g., multiply circuitry, adder circuitry, shifters, and/or memory) configured to perform accumulation operations on the outputs received from the tiles 102. Alternatively, or in addition, the vector processing unit 104 includes circuitry configured to apply a non-linear function to the outputs of the tiles 102. Alternatively, or in addition, the vector processing unit 104 generates normalized values, pooled values, or both. The vector computation outputs of the vector processing units can be stored in one or more tiles. For example, the vector computation outputs can be stored in memory uniquely associated with a tile 102. Alternatively, or in addition, the vector computation outputs of the vector processing unit 104 can be transferred to a circuit external to the ASIC 100, e.g., as an output of a computation.

Each tile 102 of the ASIC can include local memory and a computational array coupled to the memory. The local memory includes physical memory, e.g., random access memory (RAM), such as SRAM. The computational array includes multiple cells. Each cell of the computational array includes circuitry configured to perform a computation (e.g., a multiply and accumulate operation) based on data inputs, such as activation inputs and weight inputs, to the cell. Each cell can perform the computation (e.g., the multiply and accumulation operation) on a cycle of the clock signal. Each tile also includes general purpose controllable bus lines configured to transfer data among tiles. The general purpose bus lines can be configured to carry control data, activation input data, data from and/or to the communications interface, data from and/or to the vector processing unit, and data to be stored and/or used by the tile (e.g., weight inputs). One or more control elements (e.g., flip-flops and multiplexers)

can be operable to control the controllable bus lines, thereby routing data to and/or from the tile and/or from the SRAM of the tile.

In some examples, an integrated circuit, such as an ASIC, can be controlled to operate in one of two modes to satisfy operating constraints, such as constraints on a maximum amount of power consumption per unit time or a maximum rate of current through the integrated circuit. For instance, when the integrated circuit is configured in a way that is unlikely to exceed the operating constraints on the integrated circuit, the integrated circuit can be controlled to operate in a first mode. When the integrated circuit is configured to operate in a way that may exceed the operating constraints, e.g., when a large number of tiles or groups of tiles may be fully activated by receipt of an input signal, the integrated circuit can be controlled to operate in a second mode. In the second mode, a delay is introduced into the operation of some of the tiles of the integrated circuit so as to prevent the integrated circuit from exceeding the operating constraints.

Figure 2A:
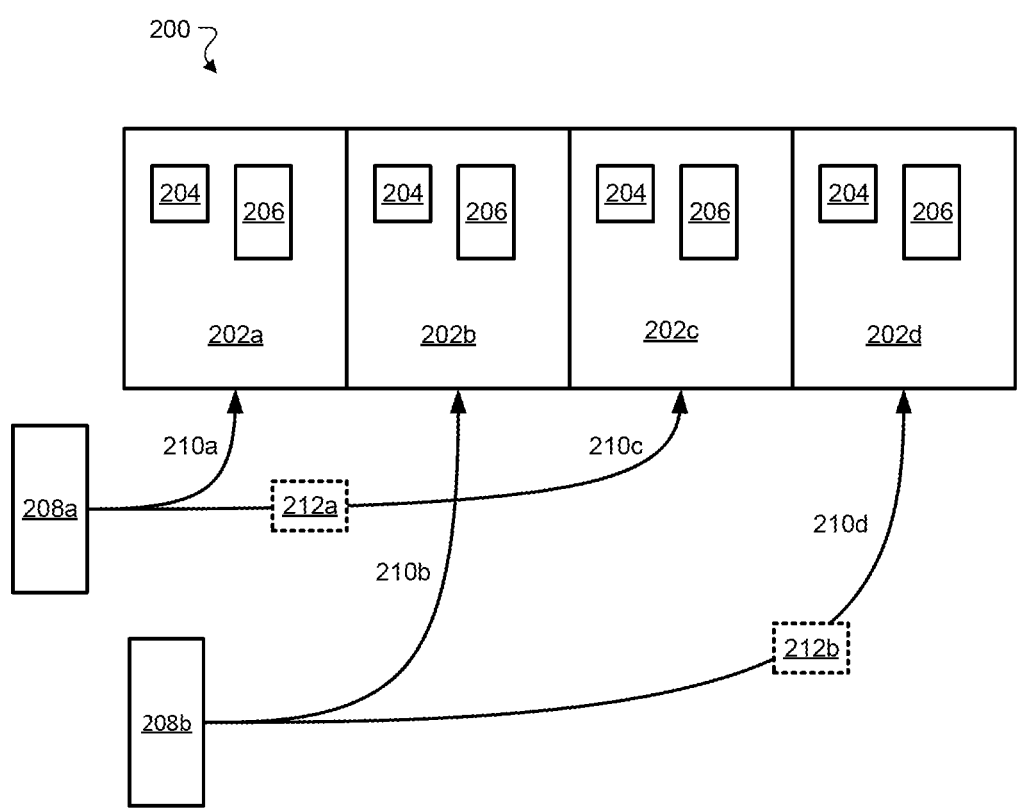
FIGS. 2A and 2B are schematics that illustrate first and second modes of operation for an array of tiles.

FIG. 2A is a simplified diagram of an array 200 of tiles 202a-202d (collectively referred to as tiles 202) of an example ASIC. Although FIG. 2A is described with respect to an ASIC, a similar configuration can apply to other types of integrated circuits. Each tile 202 includes multiple memory units, e.g., SRAMs 204, such as eight SRAMs, and a computational array of cells 206. In some examples, each tile 202 can be activated and is operable independently of each other tile 202 of the array 200. In some examples, each tile 202 in FIG. 2A represents a column of multiple tiles. In some examples, an ASIC can implement a much larger array 200, such as an array having at least 4 columns, at least 8 columns, at least 16 columns, or a still larger array. The tiles 202 of the array 200 are grouped into two subsets: a first subset including tiles 202a, 202c, and a second subset including tiles 202b, 202d.

In a first mode of operation of the array 200, the tiles of a given subset receive a common vector 208 of input data, e.g., from bus lines, memory (e.g., SRAM) from the tile or from another tile (e.g., an adjacent tile). For instance, in the example of FIG. 2A, the tiles 202a, 202c of the first subset receive a vector 208a of input data and the tiles 202b, 202d of the second subset receive a vector 208b of input data. The vectors of input data can be, for instance, vectors of weight data for neural network computations to be carried out by the computational arrays of cells 206 of the tiles 202. Vector propagation is controlled by the clock cycle of the ASIC. For instance, all of the tiles 202 (e.g., the tiles in both subsets) can receive a given vector 208 at the same clock cycle.

Bus lines 210a, 210c provide the vector 208a of input data to the tiles 202a, 202c of the first subset. A delay register 212a corresponding to the tile 202c is present on the bus line 210c. Bus lines 210b, 210d provide the vector 208b of input data to the tiles 202b, 202d of the second subset, and a delay register 212b corresponding to the tile 202d is present on the bus line 210d. However, in the first mode of operation of the array 200, the delay registers 212a, 212b are not used (as indicated by the dashed lines), and the vectors 208 of input data are provided directly, and concurrently (e.g., on the same clock cycle), to each of the tiles 202.

Each vector 208 of input data can include values for each element of the vector. For instance, when the vector 208 carries binary data, each element can have a value of 0 or a value of 1. When a tile 202 receives a vector 208 having an element of a certain value (e.g., a value 1, for binary data), processing by the computational array of cells 208 is initiated (e.g., one or more multipliers are changed from an idle state to an active state), and reading from at least one of the SRAMs 204 is also initiated. We refer to the process of initiation of processing by the computational array of cells 208 and initiation of reading from an SRAM 204 of a tile 202 as activation of the tile 202. When every tile 202 of the array 200 receives a respective vector 208 having an element that initiates computation (e.g., an element of value 1), all tiles of the array 202 are activated. In the example where each tile 202 shown in FIG. 2A represents a column of multiple tiles, a vector in which all elements having a value 1 causes activation of all tiles of the column.

In some examples, the operation of an integrated circuit, such as an ASIC, can be subject to design constraints. For instance, the power consumption per unit time can be maintained below a threshold level to avoid violating thermal design constraints of the ASIC. The rate of change of current flow through the ASIC over time (e.g., di/dt; referred to as the rate of current change) can be maintained below a threshold level to avoid driving voltages above or below a voltage threshold, such as driving voltages above or below the operating range.

Reading from memory, such as an SRAM, of a tile can be a power intensive process, and the initiation of the SRAM reading process can draw a large amount of current. At high clock cycles, a large current draw can correspond to a high rate of current change. Initiation of computational processing by a computational array (e.g., changing the state of a multiplier from idle to active) can also draw a large amount of current, and can correspond to a high rate of current change at high clock cycles.

Concurrent activation of all tiles 202 in the array 200 (e.g., initiation of processing by the computational arrays of cells 206 and initiation of reading from the SRAMs 204) can cause a large amount of power consumption and can result in a high rate of current change. The large power consumption and high rate of current change can be exacerbated when each tile 202 of the array in fact represents a column of tiles, and each tile of each column is activated, e.g., by receipt of multiple vectors each having all elements of value 1. For instance, such a vector can be supplied in an attack on the ASIC.

In some examples, such as when the number of tiles 202 activated by the input vectors 208 exceeds a threshold, the concurrent activation of those tiles 202 by the received input vectors 208 can cause the power consumption, the rate of current change, or both, to exceed a design constraint of the ASIC. For instance, the threshold number of concurrently activated tiles can be 25% of the total number of tiles or 50% of the total number of tiles. To prevent ASIC design constraints from being exceeded, the ASIC can be controlled to operate in a second mode under certain conditions. For instance, the ASIC can be controlled to operate in the second mode when the number of tiles (or columns of tiles) involved in a processing operation would cause a design constraint to be exceeded if any number of the involved tiles were to be activated, as discussed more below.

Figure 2B:
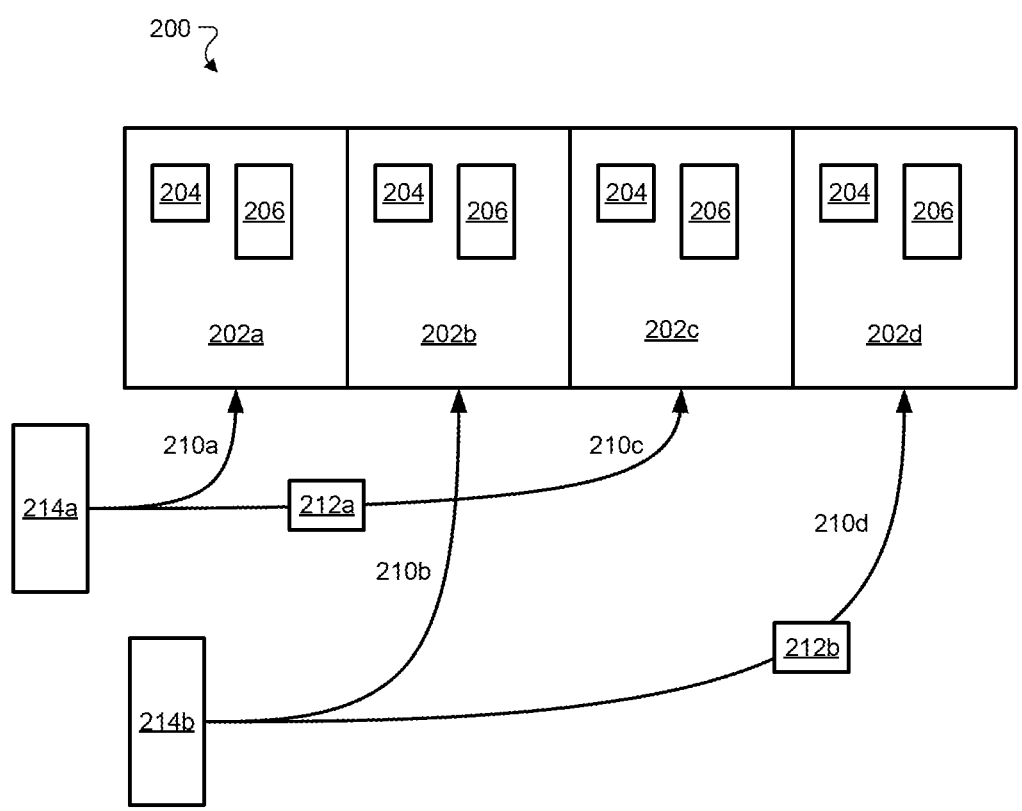

FIG. 2B shows the array 200 of tiles configured to operate in the second mode of operation. In the second mode of operation, sometimes referred to as interleaving, the delay registers 212 present on the bus lines 210 are activated such that a vector of input data provided on a bus line 210 that includes a delay register 212 is subject to a delay. For instance, in the first subset of tiles 202a, 202c, an input vector 214a that is provided concurrently to both bus lines 210a, 210c is provided directly to the tile 202a, but is held in the delay register 212a. The input vector 214a is released from the delay register 212a after a delay period and is provided to the tile 202c. For instance, the delay period can be set such that the tile 202a receives the input vector 214a on a first clock cycle and the tile 202b receives the input vector on the next (or some other subsequent) clock cycle. Similarly, the input vector 214b is received at the tile 202b on the first clock cycle but is stored in the delay register 212b, and released to the tile 202d on the next (or some other subsequent) clock cycle.

In the second mode of operation, the deliberate introduction of delay results in the interleaving, e.g., staggering, of the activation of tiles of a same subset. In this configuration, regardless of the values of the elements of the input vectors 214, no more than half of the tiles can be activated concurrently. As a result, even under an attack by vectors having all elements of value 1, the power consumption per unit time and the rate of current change can remain safely within the design constraints of the ASIC.

The mode of operation of the ASIC can be selected dynamically, e.g., on a per-computation basis, based on a configuration of the array of tiles (or columns of tiles) for a given computation. For instance, the configuration of the array can be the number of independently operable tiles (or columns of tiles) to be used to execute a given computation. The mode of operation of the ASIC can be selected based on the configuration of the array of tiles satisfying a first or second criterion. For instance, the first criterion can be that the number or percentage of independently operable tiles (or columns of tiles) falls below a threshold, and when the first criterion is satisfied the first mode of operation is implemented. The second criterion can be that the number or percentage of independently operable tiles (or columns of tiles) exceeds a threshold, and when the second criterion is satisfied the second mode of operation is implemented. The threshold can be a number or percentage of tiles such that, even if all of the tiles were to be activated concurrently, the power consumption and rate of current change would still fall within the design constraints of the ASIC. More generally, the threshold criteria may relate to a threshold utilization of the ASIC and/or hardware/operational constraints of the ASIC.

In some examples, the mode of operation of the ASIC can be controlled based on instructions from a compiler. For instance, the compiler can provide information to control circuitry, e.g., a control tile, of the ASIC indicative of the first criterion and the second criterion. The control circuitry of the ASIC can determine, for a given computation, whether the configuration of the tiles for that computation satisfies the first or second criterion, and can control the mode of operation of the array based on that determination. For instance, when the second criterion is satisfied (e.g., when the number of independently operable tiles or columns of tiles in use for a given computation exceeds a threshold), the control circuitry of the ASIC can activate the delay registers for operation in the second mode. When the first criterion is satisfied (e.g., when the number of independently operable tiles or columns of tiles in use for a given computation is less than a threshold), the control circuitry of the ASIC can de-activate the delay registers for operation in the first mode.

The transition between first and second mode can be controlled by a switching element, such as a multiplexer, that can enable the delay registers to be switched into or out of the circuit. The multiplexers can be controlled by the control circuitry of the ASIC, e.g., the control tile.

In some examples, the threshold (e.g., the threshold number of independently operable tiles or columns of tiles) can be supplied to the compiler from an external source, e.g., from a user of the ASIC that has determined the threshold configuration or from an external computer that automatically determined the threshold configuration.

In the example of FIGS. 2A and 2B, each subset includes one pair of tiles (or columns of tiles), such that in the second mode of operation, at most half of the tiles can be activated concurrently. For larger arrays than that shown in FIGS. 2A and 2B, in some examples each subset can continue to include one pair of tiles, and in some examples, each subset can include more than two tiles. For instance, each subset can include three tiles, two of which are connected to delay registers, such that in the second mode of operation, at most one-third of the tiles can be activated concurrently. In some examples, the number of tiles in the subsets can be determined by balancing the additional delay in processing associated with introducing further interleaving of the tile activation with the desire to activate concurrently only small groups of tiles (or columns of tiles).

In some examples, the delay registers can play a role in other functionality of the ASIC in addition to the operation of the array in the second mode, e.g., for synchronizing operations across a large ASIC. For instance, in a large ASIC, propagation of an input across the entire chip can take a long time, e.g., multiple clock cycles, such as tens of clock cycles. The delay registers can be used to synchronize operations given the mismatch between propagation time and clock cycle.

Figure 3:
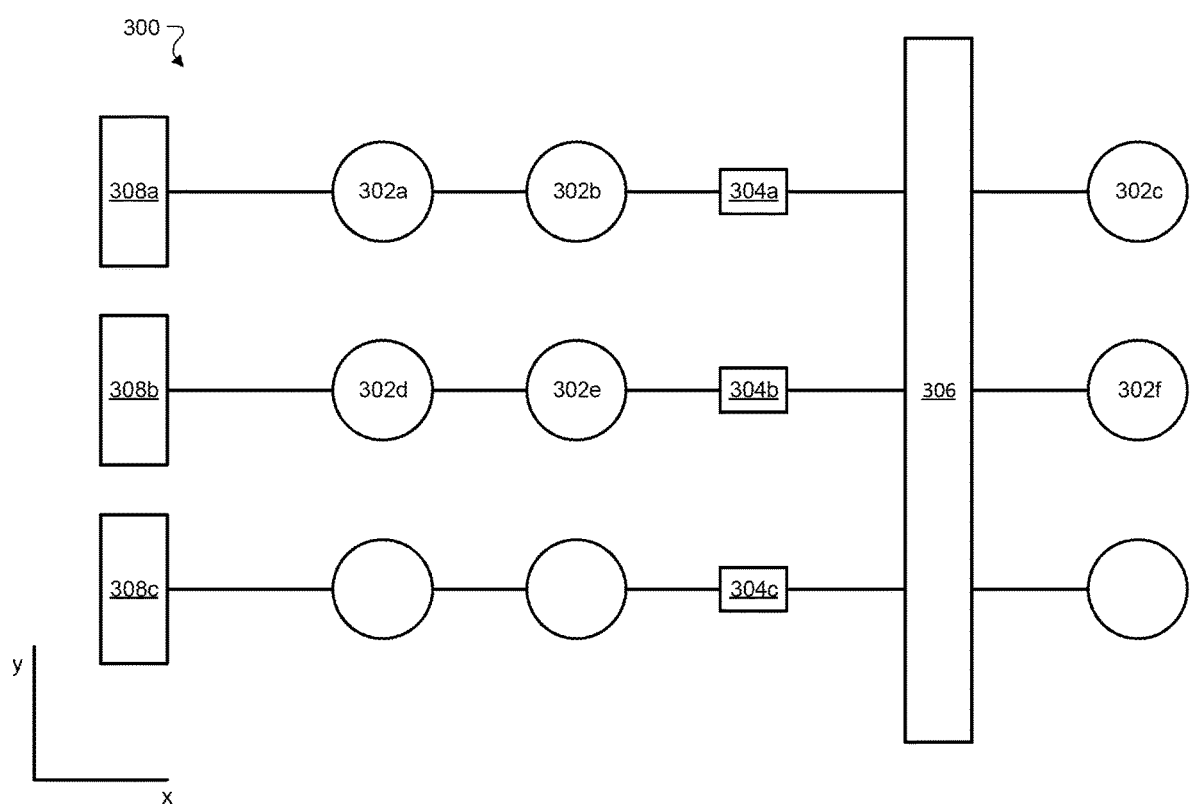
FIG. 3 is a schematic of a tile array.

Referring to FIG. 3, in some examples, the approach to operating an array of tiles in a first, concurrent mode and a second, interleaving mode can be applied to a two-dimensional array of tiles. For instance, as shown in FIG. 3, a two-dimensional array 300 of tiles 302 can include delay registers 304 that enable interleaving of signal propagation (e.g., propagation of input vectors 308) in the x direction and delay registers 306 that enable interleaving of signal propagation in the y direction.

Figure 4:
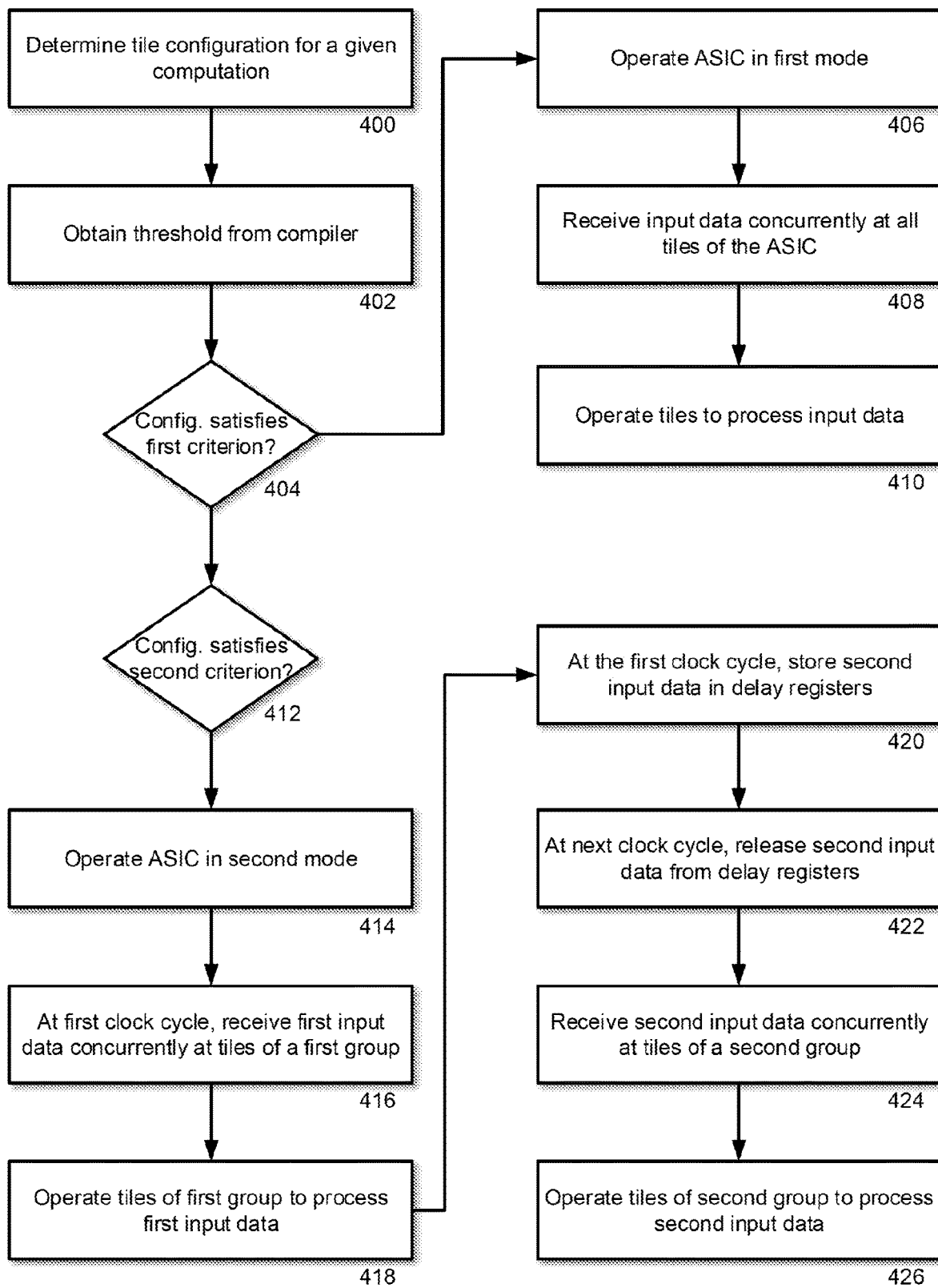
FIG. 4 is a flow chart.

Referring to FIG. 4, in an example process for operating an ASIC, a configuration of the tiles of the ASIC is determined for a given computation (400). For instance, the number or percentage of tiles that are involved in the execution of the computation is determined.

A threshold is obtained (402), e.g., from control circuitry of the ASIC. For instance, the threshold can have previously been provided to the ASIC from a compiler. The threshold may be (or relate to) a threshold utilization of the ASIC/tiles of the ASIC and/or operational/hardware constraints of the ASIC. The threshold can indicate a threshold number or percentage of tiles. Other threshold examples include, but are not limited to: a threshold energy usage; a threshold memory usage; and/or a threshold input data size.

A determination is made as to whether the configuration of the tiles satisfies a first criterion (404), e.g., whether the number or percentage of tiles involved in execution of the computation falls below the threshold. If so, the ASIC is operated in a first mode (406), including concurrently receiving input data (e.g., an input vector) for the computation at each of the tiles of the ASIC (408) and operating the tiles to process the input data (410).

Otherwise, a determination is made as that the configuration of the tiles satisfies a second criterion (412), e.g., whether the number or percentage of tiles involved in execution of the computation exceeds the threshold. If so, the ASIC is operated in a second mode (414). In the second mode, first input data for the computation is concurrently received at each tile of a first group of tiles of the ASIC at a first time, such as at a first clock cycle (416), and the tiles of the first group of tiles are operated to process the first input data (418). Also at the first time, respective second input data is stored in each of multiple delay registers (420), each delay register corresponding to a tile of a second group of tiles of the ASIC. At a second time, such as at the next clock cycle, the second input data is released from the delay registers (422). The released respective second input data is received at each tile of the second group (424), and the tiles of the second group of tiles are operated to process the second input data (426).

Referring again to FIG. 1, an example ASIC 100 can include a communication interface 108 (e.g., interfaces 108*a*, 108*b*). The communication interface 108 includes one or more sets of serializer/deserializer (SerDes) interfaces and a general purpose input/output (GPIO) interface. The SerDes interface is configured to receive instructions (e.g., instructions for operating controllable bus lines described below) and/or input data for the ASIC 100 and to output data from the ASIC 100 to an external circuit. For example, the SerDes interface can be configured to transmit instructions and/or input data at a rate of 32 Gbps, 56 Gbps, or any suitable data rate over the set of SerDes interfaces included within the communications interface 108. The GPIO interface is configured to provide an interface for debugging and/or bootstrapping. For example, the ASIC 100 may run a boot program when it is turned on. If the program fails, an administrator may use the GPIO interface to debug the source of the failure.

The ASIC 100 further includes multiple controllable bus lines configured to convey data among the communications interface 108, the vector processing unit 104, and the multiple tiles 102. Controllable bus lines include, e.g., wires that extend along both the first dimension 101 (e.g., rows) of the grid and the second dimension 103 (e.g., columns) of the grid. A first subset of the controllable bus lines extending along the first dimension 101 can be configured to transfer data in a first direction (e.g., to the right of FIG. 1). A second subset of the controllable bus lines extending along the first dimension 101 can be configured to transfer data in a second direction (e.g., to the left of FIG. 1). A first subset of the controllable bus lines extending along the second dimension 103 can be configured to transfer data in a third direction (e.g. to the top of FIG. 1). A second subset of the controllable bus lines extending along the second dimension 103 can be configured to transfer data in a fourth direction (e.g., to the bottom of FIG. 1).

Each controllable bus line includes multiple conveyer elements, such as flip-flops, that are used to convey data along the lines in accordance with a clock signal. Transferring data over a controllable bus line can include shifting, at each clock cycle, data from a first conveyer element of the controllable bus line to a second adjacent conveyer element of the controllable bus line. In some implementations, data is conveyed over the controllable bus lines upon the rising or falling edge of a clock cycle. For example, data present, at a first clock cycle, on a first conveyer element (e.g., a flip-flop) of a controllable bus line can be transferred to a second conveyer element (e.g., a flip-flop) of the controllable bus line at a second clock cycle. In some implementations, the conveyer elements can be periodically spaced apart at a fixed distance from one another. For example, in some cases, each controllable bus line includes multiple conveyer elements, with each conveyer element positioned within or proximate to a corresponding tile 102.

Each controllable bus line also includes multiple multiplexers and/or demultiplexers. A multiplexer/demultiplexer of a controllable bus line is configured to transfer data between the bus line and a component of the ASIC chip 100. For example, a multiplexer/demultiplexer of a controllable bus line can be configured to transfer data to and/or from a tile 102, to and/or from the vector processing unit 104, or to and/or from the communication interface 108. Transferring data among tiles 102, the vector processing unit 104, and the communication interface can include sending control signals to the multiplexers based on the desired data transfer to take place. The control signals can be stored in registers coupled directly to the multiplexer and/or demultiplexers. The value of the control signal then may determine, e.g., what data is transferred from a source (e.g., memory within a tile 102 or a vector processing unit 104) to a controllable bus line or, alternatively, what data is transferred from the controllable bus line to a sink (e.g., memory within a tile 102 or a vector processing unit 104).

The controllable bus lines are configured to be controlled on a local level, such that each tile, vector processing unit, and/or communication interface includes its own set of control elements for manipulating the controllable bus lines passing through that tile, vector processing unit, and/or communication interface. For example, each tile, 1D vector processing unit, and communication interface may include a corresponding set of conveyer elements, multiplexers and/or demultiplexers for controlling data transfer to and from that tile, 1D vector processing unit, and communication interface.

To minimize latency associated with operations of the ASIC chip 100, the tiles 102 and vector processing unit 104 can be positioned to reduce the distance data travels among the various components. In a particular implementation, both the tiles 102 and communication interface 108 can be segregated into multiple sections, with both the tile sections and the communication interface sections being arranged such that the maximum distance data travels between a tile and a communication interface is reduced. For instance, in some implementations, a first group of tiles 102 can be arranged in a first section on a first side of the communications interface 108, and a second group of tiles 102 can be arranged in a second section on a second side of the communication interface. As a result, the distance from a communication interface to the furthest tile may be cut in half compared to a configuration in which all of the tiles 102 are arranged in a single section on one side of the communication interface.

Alternatively, the tiles may be arranged in a different number of sections, such as four sections. For instance, in the example shown in FIG. 1, the multiple tiles 102 of ASIC 100 are arranged in multiple sections 110 (110*a*, 110*b*, 110*c*, 110*d*). Each section 110 includes a similar number of tiles 102 arranged in a grid pattern (e.g., each section 110 can include 256 tiles arranged in 16 rows and 16 columns). The communication interface 108 also is divided into multiple sections: a first communication interface 108*a* and a second communication interface 108*b* arranged on either side of the sections 110 of tiles 102. The first communication interface 108*a* can be coupled, through controllable bus lines, to the two tile sections 110*a*, 110*c* on the left side of the ASIC chip 100. The second communication interface 108*b* can be coupled, through controllable bus lines, to the two tile sections 110*b*, 110*d* on the right side of the ASIC chip 100. As a result, the maximum distance data travels (and thus the latency associated with the data propagation) to and/or from a communication interface 108 can be halved compared to an arrangement in which only a single communication interface is available. Other coupling arrangements of the tiles 102 and communication interfaces 108 are also possible to reduce data latency. The coupling arrangement of the tiles 102 and communication interface 108 can be programmed by providing control signals to the conveyer elements and multiplexers of the controllable bus lines.

In some implementations, one or more tiles 102 are configured to initiate reading and writing operations with respect to controllable bus lines and/or other tiles within the ASIC 100 (referred to herein as "control tiles"). The remaining tiles within the ASIC 100 can be configured to perform computations based on the input data (e.g., to compute layer inferences). In some implementations, the control tiles include the same components and configuration as the other tiles within the ASIC 100. The control tiles can be added as an extra tile or tiles, an extra row or rows, or an extra column or columns of the ASIC 100. For example, for a symmetric grid of tiles 102, in which each tile 102 is configured to perform a computation on input data, one or more additional rows of control tiles can be included to handle reading and writing operations for the tiles 102 performing computations on the input data. For instance, each section 110 includes 18 rows of tiles, where the last two rows of tiles may include control tiles. Providing separate control tiles increases, in some implementations, the amount of memory available in the other tiles used to perform the computations. Separate tiles dedicated to providing control as described herein are not necessary, however, and in some cases, no separate control tiles are provided. Rather, each tile may store in its local memory instructions for initiating reading and writing operations for that tile.

Furthermore, while each section 110 shown in FIG. 1 includes tiles arranged in 18 rows by 16 columns, the number of tiles 102 and their arrangement in a section can be different. For example, in some cases, the sections 110 may include an equal number of rows and columns.

Furthermore, although shown in FIG. 1 as divided into four sections, the tiles 102 can be divided into other different groupings. For example, in some implementations, the tiles 102 are grouped into two different sections, such as a first section above the vector processing unit 104 (e.g., nearer the top of the page shown in FIG. 1) and a second section below the vector processing unit 104 (e.g., nearer to the bottom of the page shown in FIG. 1). In such an arrangement, each section may contain, e.g., 576 tiles arranged in a grid of 18 tiles down (along direction 103) by 32 tiles across (along direction 101). Sections may contain other total numbers of tiles and may be arranged in different sized arrays. In some cases, the divisions between sections are delineated by hardware features of the ASIC 100. For example, as shown in FIG. 1, sections 110a, 110b may be separated from sections 110c, 110d by the vector processing unit 104.

As explained herein, in some implementations, one or more of the tiles 102 are dedicated to storing control information. That is, the tiles 102 dedicated to storing control information do not take part in performing calculations on input data such as weight inputs and activation inputs. Control information can include, e.g., control data for configuring the controllable bus lines during operation of the ASIC chip 100 so that data can be moved around the ASIC chip 100. The control data can be provided to the controllable bus lines in the form of control signals for controlling the conveyer elements and multiplexers of the controllable bus lines. The control data specifies whether particular conveyer elements of the controllable bus lines pass data to a next conveyer element of the controllable bus line so that data is transferred among the tiles according to a predetermined schedule. The control data additionally specifies whether data is transferred from or to a bus line. For example, the control data can include control signals that direct a multiplexer to transfer data from a bus line to memory and/or other circuitry within a tile. In another example, the control data can include control signals that direct a multiplexer to transfer data from the memory and/or circuitry within the tile to the bus line. In another example, the control data can include control signals that direct a multiplexer to transfer data between a bus line and the communications interface 108 and/or between the bus line and the vector processing unit 104. Alternatively, as disclosed herein, dedicated control tiles are not used. Rather, in such cases, the local memory of each tile stores the control information for that particular tile.

Embodiments of the subject matter and the functional operations described in this specification can be implemented in digital electronic circuitry, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC. The apparatus can also include, in addition to hardware, code that creates an execution environment for the computer program in question, e.g., code that constitutes processor firmware, a protocol stack, a database management system, an operating system, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA, an ASIC, or a GPGPU (general purpose graphics processing unit).

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, although bus lines are described as "controllable," not all bus lines need to have the same level of control. For instance, there can be varying degrees of controllability, where some bus lines can be controlled only where some bus lines are restricted in terms of the number of tiles from which they can source data or to which they can send data. In an another example, some bus lines may be dedicated to providing data along a single direction, such as north, east, west, or south as described herein. In some cases, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method for operating an integrated circuit chip comprising multiple tiles, the method comprising:
    determining a configuration for the tiles of the integrated circuit for execution of a computation;
    when the configuration for the tiles satisfies a first criterion, operating the integrated circuit in a first mode, including:
        concurrently receiving respective input data for the computation at each of the tiles of the integrated circuit; and
    when the configuration for the tiles satisfies a second criterion, operating the integrated circuit in a second mode, including:
        at a first time, concurrently receiving respective first input data for the computation at each tile of a first group of tiles of the integrated circuit;
        at the first time, storing respective second input data for the computation in each of multiple delay registers, each delay register corresponding to a tile of a second group of tiles of the integrated circuit; and
        at a second time, releasing the second input data from the delay registers and receiving the released respective second input data at each tile of the second group of tiles.

2. The method of claim 1, wherein determining a configuration for the tiles for execution of the computation comprises determining one or more of a number and a percentage of tiles operable for executing the computation.

3. The method of claim 2, wherein:
    the first criterion comprises the number or percentage of tiles operable for executing the computation being less than a threshold number or percentage, and
    the second criterion comprises the number or percentage of tiles operable for executing the computation being greater than a threshold number or percentage.

4. The method of claim 1, wherein determining a configuration for the tiles for execution of the computation comprises determining a number of columns of tiles operable for executing the computation.

5. The method of claim 4, wherein:
    the first criterion comprises the number or percentage of columns of tiles operable for executing the computation being less than a threshold number or percentage, and
    the second criterion comprises the number or percentage of columns of tiles operable for executing the computation being greater than a threshold number or percentage.

6. The method of claim 1, comprising determining whether the configuration for the tiles satisfies the first criterion or the second criterion.

7. The method of claim 1, wherein operating the integrated circuit in a second mode comprises operating a multiplexer to enable the delay registers.

8. The method of claim 7, wherein operating the integrated circuit in a first mode comprises operating the multiplexer to disable the delay registers.

9. The method of claim 1, wherein the first time is a first clock cycle and the second time is the next clock cycle.

10. The method of claim 1, wherein concurrently receiving respective input data in the first mode comprises receiving a vector of input data at each tile.

11. The method of claim 1, wherein operating the integrated circuit in a first mode comprises operating each of the tiles of the integrated circuit to process the respective input data.

12. The method of claim 1, wherein operating the integrated circuit in a second mode comprises:
    operating each of the tiles of the first group to process the respective first input data; and
    operating each of the tiles of the second group to process the respective second input data released from the delay register.

13. The method of claim 1, comprising receiving an indication of the first criterion and the second criterion from a compiler.

14. An integrated circuit comprising:
    multiple delay registers each connected to a corresponding first bus line;
    multiple tiles, each tile of a first group of the tiles connected to a corresponding second bus line, and each tile of a second group of the tiles connected to a corresponding one of the first bus lines; and
    a controller configured to:
        determine a configuration of the first and second groups of tiles for execution of a computation;
        when the configuration for the tiles satisfies a first criterion, control the integrated circuit to operate in a first mode in which respective input data for the computation is concurrently received at each of the multiple tiles via the first and second bus lines; and
        when the configuration for the tiles satisfies a second criterion, control the integrated circuit to operate in a second mode, in which:
            at a first time, respective first input data for the computation is concurrently received at each tile of the first group of tiles;
            at the first time, second input data for the computation is stored in each of the delay registers; and at a second time, the second input data is released from the delay registers and the respective second input data is received at each tile of the second group of tiles.

15. The integrated circuit of claim 14, comprising a multiplexer connected to each second bus line.

16. The integrated circuit of claim 14, wherein the tiles are arranged in a two-dimensional array.

17. The integrated circuit of claim 14, wherein the integrated circuit comprises an application-specific integrated circuit (ASIC).

18. The integrated circuit of claim 14, wherein each tile comprises:
multiple computational cells;
a memory coupled to the computational cells; and
controllable bus lines configured to convey data to or from the tile.

19. The integrated circuit of claim 14, wherein at least one of the tiles is configured to act as the controller.

20. The integrated circuit of claim 14, comprising a communication interface.

* * * * *